United States Patent
Maeda et al.

(10) Patent No.: US 9,715,568 B2
(45) Date of Patent: Jul. 25, 2017

(54) WIRING LENGTH MEASUREMENT APPARATUS AND RECORDING MEDIA

(71) Applicant: LIQUID DESIGN SYSTEMS INC., Yokohama-shi, Kanagawa (JP)

(72) Inventors: Shinichi Maeda, Higashikurume (JP); Katsuhiko Iwase, Yokohama (JP)

(73) Assignee: LIQUID DESIGN SYSTEMS INC., Yokohama-Shi (JP)

( * ) Notice: Subject to any disclaimer, the term of this patent is extended or adjusted under 35 U.S.C. 154(b) by 284 days.

(21) Appl. No.: 14/411,807

(22) PCT Filed: Jun. 6, 2014

(86) PCT No.: PCT/JP2014/065123
§ 371 (c)(1),
(2) Date: Dec. 29, 2014

(87) PCT Pub. No.: WO2015/012002
PCT Pub. Date: Jan. 29, 2015

(65) Prior Publication Data
US 2016/0267213 A1    Sep. 15, 2016

(30) Foreign Application Priority Data
Jul. 23, 2013  (JP) .................................. 2013-153099

(51) Int. Cl.
*G06F 11/22* (2006.01)
*G06F 17/50* (2006.01)
*H01L 27/02* (2006.01)

(52) U.S. Cl.
CPC ...... *G06F 17/5081* (2013.01); *H01L 27/0203* (2013.01)

(58) Field of Classification Search
USPC .......................... 716/106, 107, 111, 136, 139
See application file for complete search history.

(56) References Cited

U.S. PATENT DOCUMENTS

| | | | | |
|---|---|---|---|---|
| 5,883,812 | A * | 3/1999 | Fujii | G06F 17/5077 716/130 |
| 6,045,584 | A * | 4/2000 | Benzel | G06F 17/5081 345/673 |
| 6,430,734 | B1 * | 8/2002 | Zahar | G06F 17/5077 716/126 |
| 6,606,737 | B1 * | 8/2003 | Zahar | G06F 17/5072 716/125 |
| 6,687,892 | B1 * | 2/2004 | Zahar | G06F 17/5072 716/129 |
| 6,915,499 | B1 * | 7/2005 | Teig | G06F 17/5077 716/129 |

(Continued)

Primary Examiner — Brian Ngo
(74) Attorney, Agent, or Firm — R. Neil Sudol; Henry D. Coleman

(57) ABSTRACT

The wiring length measurement apparatus includes a distance calculation unit, by using a plurality of coordinates of bending points and a wiring width of CAD data of a high-density wiring including a meander wiring, seeking each endpoint that exists on an edge in a wiring width direction and is a flexion point of each inner circuit side, and calculating distances between each adjacent endpoint and a measurement unit measuring a wiring length of the high-density wiring by calculating a sum of the distances between each endpoint calculated by the distance calculation unit.

12 Claims, 10 Drawing Sheets

(56) References Cited

U.S. PATENT DOCUMENTS

| | | | | |
|---|---|---|---|---|
| 8,146,025 | B2* | 3/2012 | Yang | G06F 17/5081 716/112 |
| 2001/0038612 | A1* | 11/2001 | Vaughn | G06F 17/5077 370/256 |
| 2002/0100007 | A1* | 7/2002 | Teig | G06F 17/5072 716/124 |
| 2003/0023943 | A1* | 1/2003 | Teig | G06F 17/5072 716/113 |
| 2004/0068704 | A1* | 4/2004 | Park | G06F 17/5036 716/111 |
| 2008/0141195 | A1* | 6/2008 | Torres Robles | G06F 17/5081 716/52 |

\* cited by examiner

SIGNAL PROPAGATION PATH

WIRING LENGTH MEASUREMENT APPARATUS AND RECORDING MEDIA

TECHNICAL FILED

The present invention relates to a wiring length measurement apparatus and a recording media.

BACKGROUND ART

For high-density wiring (for example, high density integrated circuit, interposer wiring, print wiring board, etc. The same below) to comply with DRAM standards such as DDR3 and DDR4, etc., it becomes necessary to have at least 10 ultrahigh-speed parallel bus signals of frequencies greater than 1 GHz. It becomes necessary for such ultrahigh-speed parallel bus signals to reach from the driver to the receiver with a wiring delay error within the range of 10 picoseconds.

When performing the wiring designing using CAD for such high-density wiring, in order to unify the delay time of the parallel bus signals, it becomes necessary to arrange the wire lengths of the parallel bus signals.

On the other hand, with high-density integrated circuit within high-density wiring, the pin's physical location is not unified. Because of this, the wiring length of the parallel bus signal cannot be arranged by simply wiring from pin to pin. Therefore, in order to arrange each wiring length, the meander wiring, wiring which has a staggered form (serpentine shape), is used.

To arrange the wiring length of the parallel bus signal, it is necessary to measure the wiring length. For this reason, wiring length measurement becomes an extremely important design guideline. Because of this, CAD has the ability to calculate the wiring length of high-density wiring, which is the design target, and the ability to measure the wiring length with high precision is required.

Conventionally, after configuration of the multiple clock synchronous sequential circuit has been completed, the distance from the clock building device's clock output terminal to the clock input terminal of each clock synchronous sequential circuit is measured and the technology that performs the wiring to ensure that each distance is equal is disclosed (Patent literature 1 reference).

PRIOR ART LITERATURE

Patent Literature

Patent Literature 1: Japanese Patent Application Laid-Open Hei9-283628

SUMMARY OF THE INVENTION

Technical Problems Solved by the Invention

The present invention is proposed with conventional technology in consideration.

Means for Solving the Problems

A wiring length measurement apparatus of the present invention includes a distance calculation unit, by using a plurality of coordinates of bending points and a wiring width of CAD data of a high-density wiring including a meander wiring, seeking each endpoint that exists on an edge in a wiring width direction and is a flexion point of each inner circuit side, and calculating distances between each adjacent endpoint and a measurement unit measuring a wiring length of the high-density wiring by calculating a sum of the distances between each endpoint calculated by the distance calculation unit.

A recording media in which a wiring length measurement program related to the present invention is recorded, records the program as a way to function a computer as a varied means of the wiring length measurement apparatus of the intervention.

Effect of the Invention

The present invention allows for accurate measurement of the wiring length of high-density wiring that includes meander wiring.

DESCRIPTION OF EMBODIMENTS

By referencing drawings, the form for the implementation of the invention is described in detail, below.

[Constitution]

Figure 1:
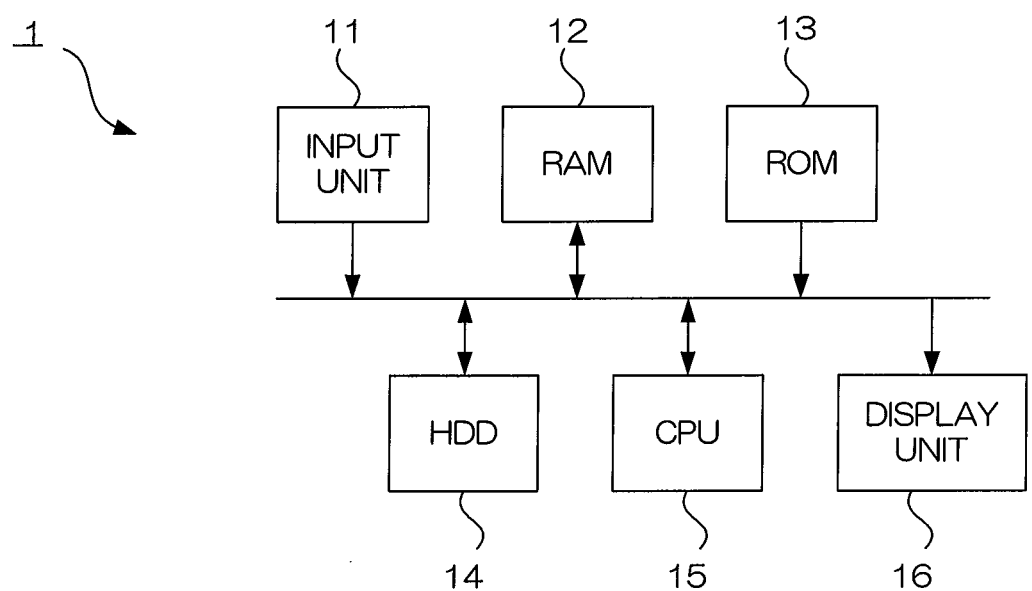
FIG. 1 is a block diagram that shows the constitution of the wiring length measurement apparatus.

FIG. 1 is a block diagram that depicts the constitution of a wiring length measurement apparatus 1.

The wiring length measurement apparatus 1 is equipped in a CAD system for designing high signal wiring with signal frequencies greater than 1 GHz (for example, high density degree accumulation circuit, interposer, same below). The wiring length measurement apparatus 1 measures the length of the high signal wiring that includes the design target's meander wiring.

The wiring length measurement apparatus 1 includes; an input unit 11 which inputs data according to the user's operation; a RAM 12 which temporarily stores data; a ROM 13 which stores the program data for measurement of wiring length; a hard disk 14 which stores the CAD data rank; a CPU 15 which performs the calculation processing in accordance with the program data of the ROM 13; and a display unit 16 which indicates the calculation processing outcome. CAD data is data necessary for the components of wiring designing such as, for example, wiring corner (bending point) coordinates (X, Y), wiring's signal frequency f, and wiring width m. The wiring length measurement apparatus 1 can be a so-called personal computer (PC) with the installation of a program recorded by wiring media such as the optical disk.

[Meander Wiring]

Figure 2:
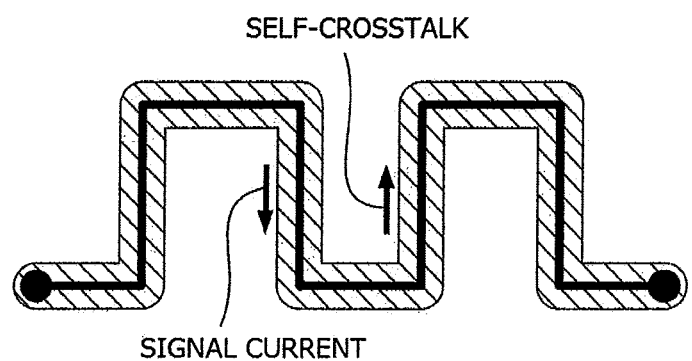
FIG. 2 is a drawing for the description of the meander wiring's self-crosstalk.
Figure 3:
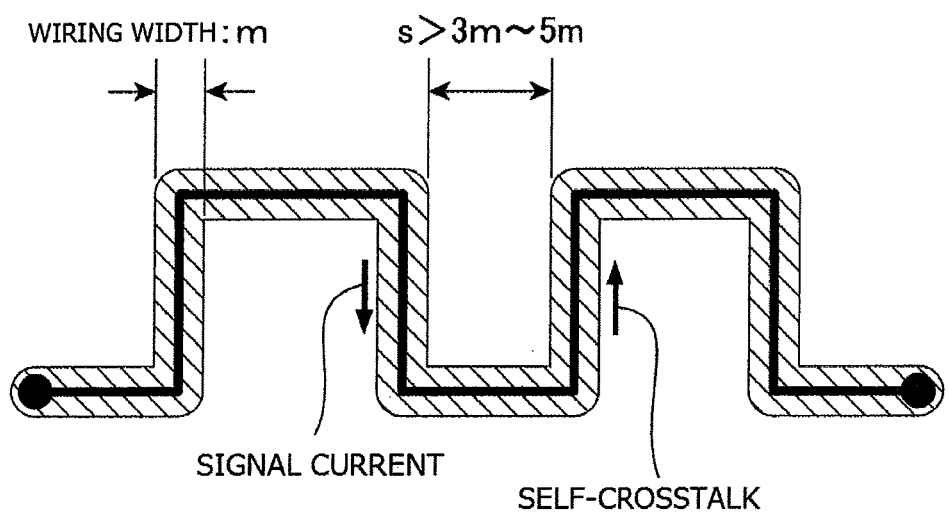
FIG. 3 is a drawing for the description of one case of the wiring interval's rule that constitutes the meander wiring's wiring width.

As shown in FIG. 2, with meander wiring utilized by high-density wiring, self-crosstalk occurs between adjacent wiring. Thus, when designing high-density integrated circuits, it becomes necessary to minimize the variation of the signal propagation speed due to meander wiring's self-crosstalk. Thus, as depicted in FIG. 3, it is required that the meander wiring's wiring interval s be at least twice that of the general wiring interval, where, for example, there is a rule for it to be 3-5 times the wiring width w.

However, despite performing the wiring to minimize the impact of the self-crosstalk amongst wiring as much as possible, the propagation delay of the signal in meander wiring is far less than the propagation delay of the general wiring. A factor for this is the conventional CAD algorithm of calculating the wire lengths by simply integrating the distance between the meander wiring's bending points.

Figure 4:
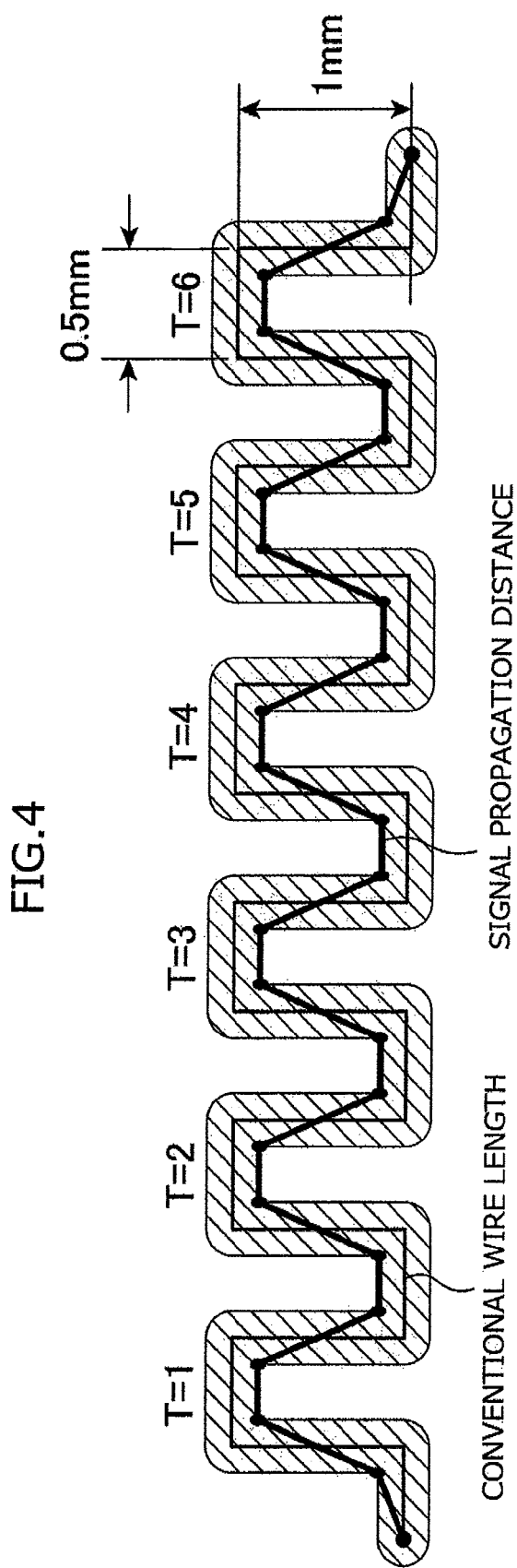
FIG. 4 is a drawing that compares the meander wiring's wiring length as calculated by CAD data, and the actual signal propagation distance.

FIG. 4 shows a small meander wiring of general regulation of 6 segments with wire width m=0.1 mm and wire interval s=0.44 mm with distance of 1 mm. Conventional wire length of the wire that passes through the center of the meander wiring within the figure was calculated using CAD data. The wiring that connects each flexion point of each inner circuit side on the tops of the ends of the meander wiring's width orientation (border wiring) shows the actual signal propagation distance.

A wire length calculated by the use of CAD data is compared with the actual signal propagation distance. Conventional wire length calculated by CAD data is 17.5 mm (=0.5 mm*11+1 mm*12), and becomes approximately 15% longer than the actual signal propagation distance 15.26 mm (=0.4 mm*11+0.905 mm*12). Then, propagation delay error becomes 13.5 (=(17.5-15.25)*6) ps.

Specifically, in the event of long-distance wiring with a signal frequency of greater than 1 GHz, there are times when the wiring width is increased in order to decrease the impact of the surface resistance. However, the more the wiring width is increased, the more a propagation delay error is increased.

In order to respond to the actual signal propagation distance, the wiring length measurement equipment 1 measures the wiring length. Furthermore, with the present form of implementation, the condition of the meander wiring has been defined as follows.

3m<s<10m and 5m<b

Figure 8A:
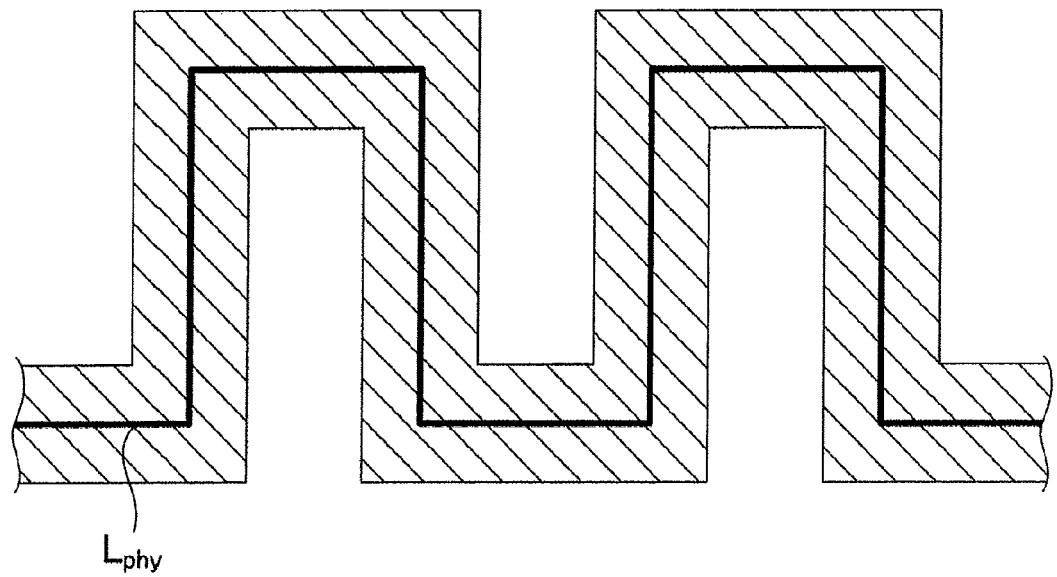
FIG. 8A is a drawing that shows the basic wiring length, $L_{phy}$, of meander wiring.
Figure 8B:
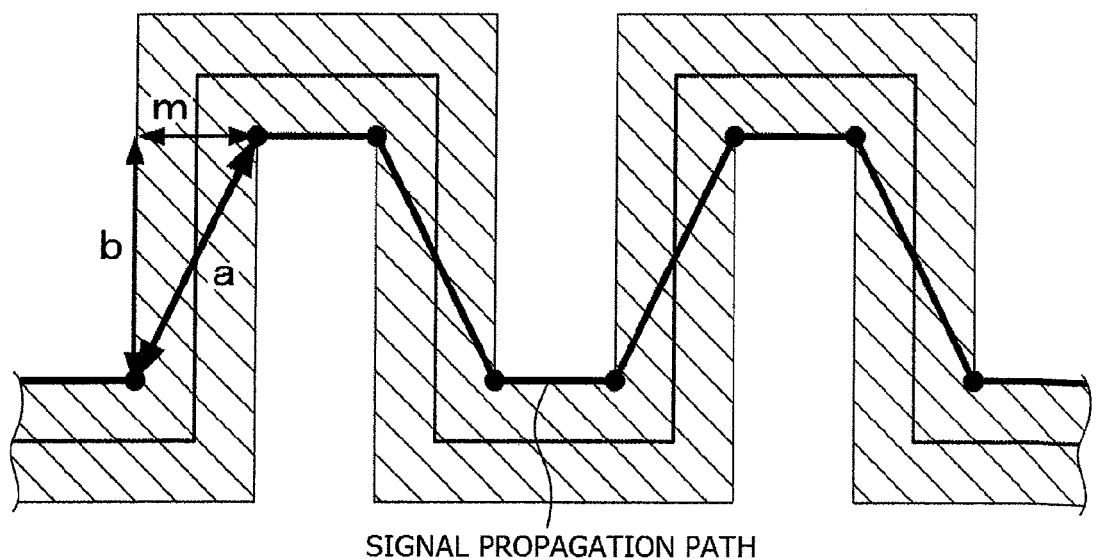
FIG. 8B is a drawing Figure that shows the actual signal propagation route of the meander wiring.

Wire width shall be m, bending length b, and wire interval s (FIG. 3, Reference FIG. 8 to be mentioned later). It should be noted that the bending length b refers to the length of the vertical axis path (orthogonal path in reference to width path) from the vicinity within the circumference of one side of the meander wiring (for example the protrusions of the meander wiring in FIG. 8B) to the vicinity within the circumference of the opposite side (for example the indentations of the meander wiring in FIG. 8B).

[Wiring Length Measurement Routine]

The CPU 15 of the wiring length measurement apparatus 1 that has been organized as in FIG. 1 undergoes a wiring length measurement routine.

Figure 5:
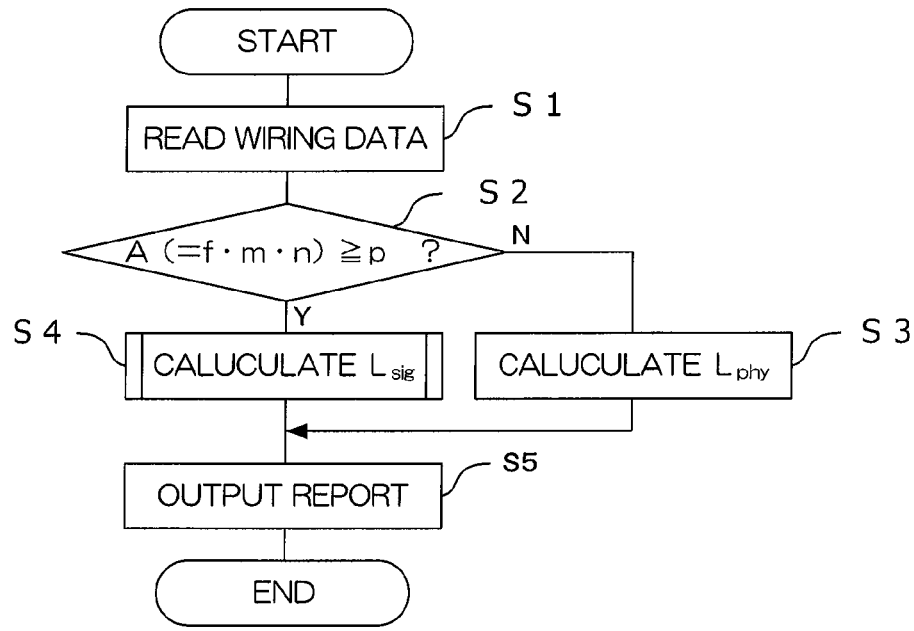
FIG. 5 is a flowchart that shows the wiring length measurement routine.

FIG. 5 is a flowchart that depicts the wiring length measurement routine by the CPU 15. Wiring length measurement routine is of signal frequency f (GHz) and is an algorithm to determine the wiring length of high-density accumulation circuits that possess meander wiring.

In step S1, the CPU 15 reads the wiring data (wiring frequency f, wiring bending point coordinates, wiring width m, etc.) from the CAD data stored in HDD 13. Furthermore, because the data sequence and the way to hold the data differs due to CAD, wiring data is sorted in a way such that they are a series of coordinate sequences. Additionally, the CPU 15 calculates the number of bends in the wiring n (=coordinate number of bending point–2).

In step S2, the CPU 15 calculates the decision formula A by multiplying the signal frequency f, wiring width m, and number of bends (=m*n*f), and judges whether the judgment formula is A≥p. It should be noted that p is a CAD vendor and a parameter that can be set arbitrarily by the user.

In the event that the judgment formula is not A≥p, because the error between the basic wiring length $L_{phy}$ calculated by conventional CAD and the signal propagation distance is smaller than the threshold, that error is minor enough to disregard. Therefore, the CPU 15 switches over to the processing of Step 3. On the other hand, in the event that the judgment formula is A≥p, because the error between the basic wiring length $L_{phy}$ calculated by conventional CAD and the signal propagation distance is greater than the threshold, that error is too great to ignore. Thus, the CPU 15 changes the processing of Step S4.

In Step S3, by using the coordinates of the bending points of the wiring $(X_g, Y_g)$ (g=0~n) and the number of bends, the CPU 15 calculates the standard/basic wiring length $L_{phy}$ through the integration of the distance between the bending points (Referenced in FIG. 8 later).

$$L\,phy = \sum_{g=0}^{n-1} \sqrt{(X_g - X_{g+1})^2 + (Y_g - Y_{g+1})^2} \quad \text{[Equation 1]}$$

Here, $(X_0, Y_0)$ are the coordinates of the starting point of the wiring, and $(X_n, Y_n)$ are the coordinates of the ending point of the wiring.

In Step S4, the CPU 15 calculates the approximate wiring length $L_{sig}$ that is approximate to the signal propagation distance, by running the subroutine to be mentioned later.

In Step S5, the CPU 15 terminates the original routine by displaying the calculation report (summation) for Step S3 or Step S4 as a report for wiring length on display unit 16 or by passing it to manual wiring/automatic wiring software.

[First Subroutine]

Figure 6:
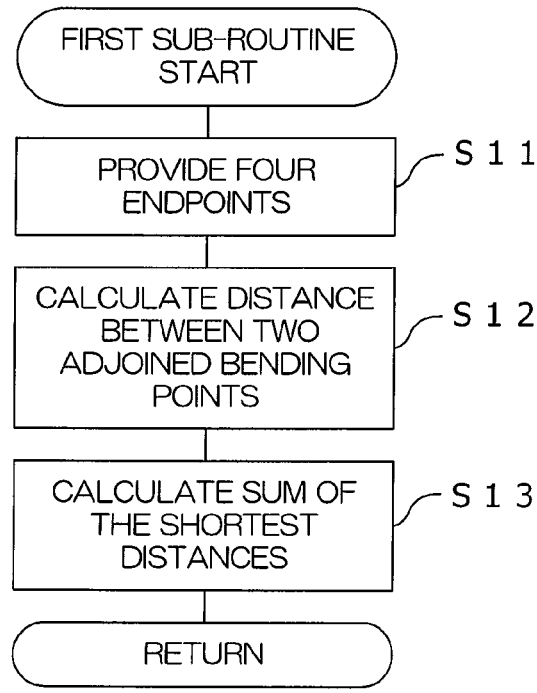
FIG. 6 is a flowchart that shows the First of the Subroutines of Step S4.

FIG. 6 is a flowchart that shows the first subroutine run in Step S4. Here, the corner portion of the meander wiring is nearly perpendicular.

In Step S11, the CPU 15 provides the four endpoints $(X_{g1}, Y_{g1})$, $(X_{g2}, Y_{g2})$, $(X_{g3}, Y_{g3})$, $(X_{g4}, Y_{g4})$ that are the measurement candidate points in reference to one of the bending points $(X_g, Y_g)$ on the wiring.

Figure 7A:
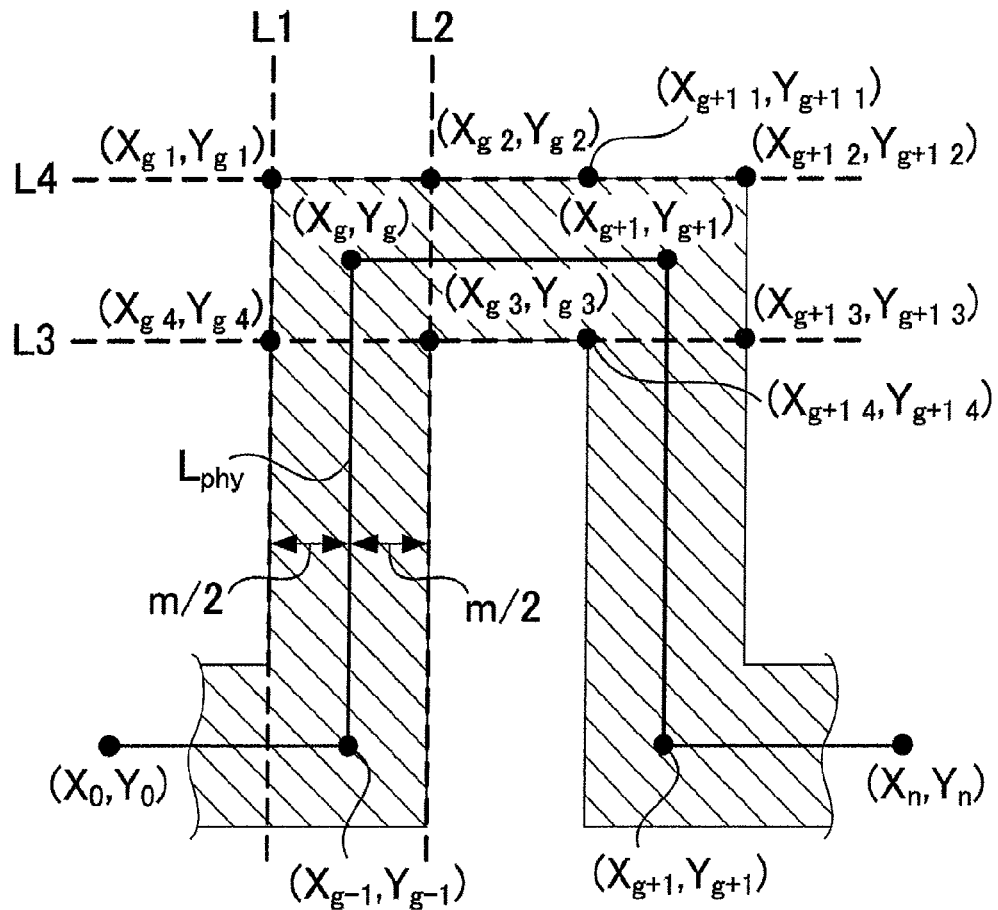
FIG. 7A is a drawing that shows the four endpoints that go against the bending point $(X_g, Y_g)$.

FIG. 7A shows the four endpoints $(X_{g1}, Y_{g1})$, $(X_{g2}, Y_{g2})$, $(X_{g3}, Y_{g3})$, $(X_{g4}, Y_{g4})$ derived from the bending point $(X_g, Y_g)$. The wiring area (the diagonal area of FIG. 7A) is determined based on each bending point $(X_g, Y_g)$ (g=0~n) and wiring width m. The four endpoints in reference in the bending points $(X_g, Y_g)$ are established in the following way.

First, the CPU 15 provides two imaginary lines of length $\sqrt{2}*m$ (m: wire width) in reference to the bending point $(X_g, Y_g)$. Next, the CPU 15 intersects the two imaginary lines in the same way as the two diagonals of a square. Then, the CPU 15 configures the 2 imaginary lines so that the intersecting point of the bending point and two imaginary lines correspond, and so that the angle created by the straight line created by the bending point $(X_g, Y_g)$ and the bending point that corresponds to that bending point, and above-mentioned imaginary line become 45-degrees. Finally, as shown in FIG. 7, the CPU 15 makes each of the end points of each virtual line $(X_{g1}, Y_{g1})$, $(X_{g2}, Y_{g2})$, $(X_{g3}, Y_{g3})$, $(X_{g4}, Y_{g4})$. In reference to the bending points $(X_g, Y_g)$ on each wiring, the CPU 15 sets the four endpoints as mentioned above.

The above-mentioned example is a situation in which the wiring's turn angle θ is 90-degrees, but the turn angle θ is not limited to this situation. In situations when the turn angle is an arbitrary angle (including 90-degrees), the four endpoints in reference to the bending points $(X_g, Y_g)$ are determined as follows.

Figure 7B:
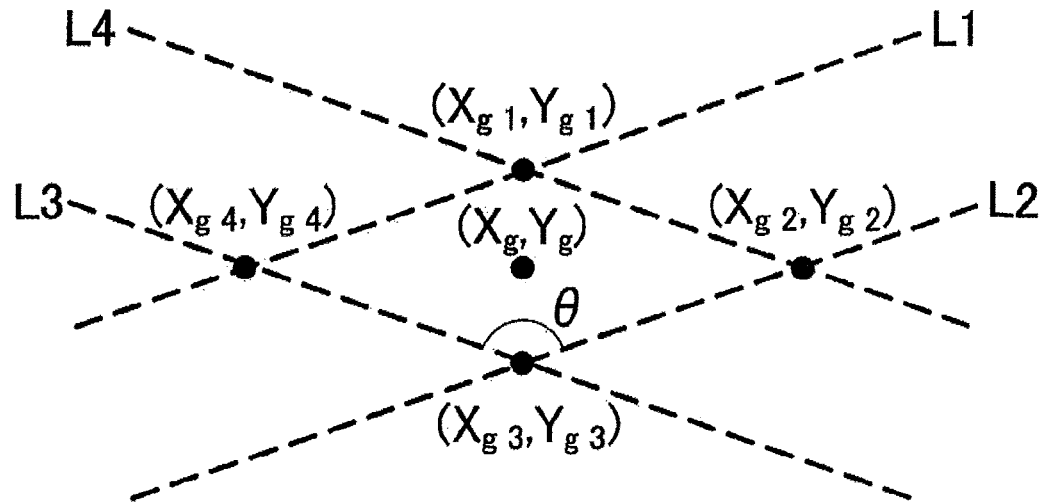
FIG. 7B is a drawing that shows the four endpoints that go against the bending point $(X_g, Y_g)$.

FIG. 7B is an explanation figure on how to determine the four endpoints in reference to the bending points $(X_g, Y_g)$.

First, while forming a wiring area of wiring width m between the bending point $(X_g, Y_g)$ and bending point just before it (1 before adjacent) $(X_{g-1}, Y_{g-1})$, the CPU 15 creates one pair of parallel, straight lines L1, L2 that become the wiring area's boundary (boundary straight lines). Because of this, boundary straight lines L1 and L2 clasp the straight lines that pass through the two bending points $(X_g, Y_g)$ and $(X_{g-1}, Y_{g-1})$, and each is spread apart the same distance.

Next, while forming the wiring area of wiring width m between the bending point $(X_g, Y_g)$ and bending point immediately after it (one after adjacent) $(X_{g+1}, Y_{g+1})$, the CPU 15 creates one pair of parallel, straight lines L3, L4 that become the wiring area's boundary (boundary straight lines). Because of this, boundary straight lines L1 and L2 clasp the straight lines that pass through the two bending points $(X_g, Y_g)$ and $(X_{g+1}, Y_{g+1})$, and each is spread apart the same distance.

Finally, the CPU 15 establishes four intersection points out of boundary straight lines L1, L2, L3, L4 on the aforementioned endpoints $(X_{g1}, Y_{g1})$, $(X_{g2}, Y_{g2})$, $(X_{g3}, Y_{g3})$, $(X_{g4}, Y_{g4})$. the CPU 15 creates four endpoints as aforementioned in each bending point $(X_g, Y_g)$ (from g=1 to (n−1)) besides the first (g=0) and last (g=n).

Furthermore, in the event that the bending point $(X_g, Y_g)$ is both the starting point and ending point of the high-density wiring, the endpoint is found in the following way. In reference to the multiple endpoints in relation to the bending points, several intersection points from the boundary straight lines that pass through the neighborhood of the bending points of concern, and the straight line that passes through the bending point of concern and is orthogonal to the aforementioned boundary straight lines, are established.

In Step S12, the CPU 15 calculates the distance between two adjoined bending points, therefore the distance between $(X_g, Y_g)$ and $(X_{g-1}, Y_{g-1})$, as follows.

The CPU 15 calculates the distances between each endpoint $(X_{gj}, Y_{gj})$ in reference to the bending points $(X_g, Y_g)$ and each endpoint in reference to the next bending point $(X_{g+1}, Y_{g+1})$, and the shortest distance amongst them is considered to be the distance between those bending points. The distance between each adjacent bending point is sought out.

For example, as FIG. 7A shows, regarding the distance between bending points $(X_g, Y_g)$ and $(X_{g+1}, Y_{g+1})$, the distance between endpoints $(X_{g3}, Y_{g3})$ and $(X_{g+1\ 4}, Y_{g+1\ 4})$ and the distance between endpoints $(X_{g2}, Y_{g2})$ and $(X_{g+1\ 4}, Y_{g+1\ 4})$ become the shortest distances. Here, the distance between the endpoints $(X_{g3}, Y_{g3})$ and $(X_{g+1\ 4}, Y_{g+1\ 4})$, which are the inner circuit sides of the corner units, become selected.

In Step S13, the CPU 15 seeks out the sum of the shortest distances between all bending points, and this sum becomes the approximate wiring length $L_{sig}$.

$$L\,sig = \sum_{g=0}^{n-1} \min_{j=1\sim 4} \left\{ \sqrt{(X_{gj} - X_{g+1j})^2 + (Y_{gj} - Y_{g+1j})^2} \right\} \quad \text{[Equation 2]}$$

Figure 8C:
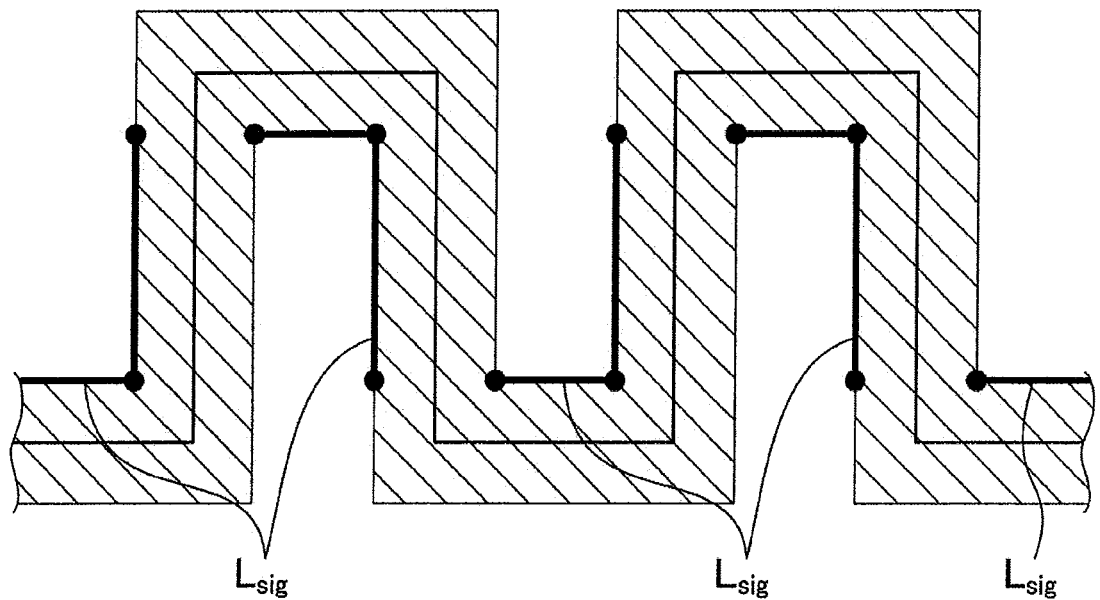
FIG. 8C is a drawing that shows the suspected wiring length, $L_{sig}$, of the meander wiring.

FIG. 8A shows the standard wiring length $L_{phy}$, FIG. 8B shows the actual signal propagation path, and FIG. 8C shows the approximate wiring length $L_{sig}$.

Standard wiring length $L_{phy}$, as FIG. 8A shows, is a mere connection between each of CAD data's bending points, and passes through the center portion of the wiring width.

However, as FIG. 8B shows, the actual signal propagation path within meander wiring exists on the ends of the wiring's width direction and due to the connection of each flexion point of the inner circuit sides. In short, the actual signal propagation path is sequenced from the shortest distance from the wiring's starting point to end point and there are times when the meander wiring is propagated diagonally.

In relation to this, as FIG. 8C shows, the approximate wiring length $L_{sig}$ becomes the approximate length of the actual signal propagation path.

The approximate wiring length $L_{sig}$, in regards to each bending point, is the total of the shortest distances found between each endpoint in relation to bending point of concern and each endpoint in relation to the bending point adjacent to the bending point of concern. Because of this, the approximate wiring length $L_{sig}$ is not continuous, and is divided from place to place. Thus, the approximate wiring length $L_{sig}$ is not completely consistent with the length of the meander wiring's signal propagation path.

However, as in FIG. 8B, in the event that the meander wiring's bending length "b" in relation to the wiring width m is 10 times the wiring width m, the measurement error becomes 0.5% (for example, if the wiring width m is 0.1 mm and the bending length b is 1 mm, its measurement error is 0.005 mm). For a measurement error of this degree, ignoring it is not problematic.

In this way, there is a possibility that the approximate wiring length $L_{sig}$ becomes about 0.5% shorter than the actual signal propagation path. However, this is the same pattern of measurement error as the meander wiring's self-crosstalk result. Because of this, each becomes counterbalanced, where the actual measurement error is decreased even further than 0.5%.

There is no problem considering it as, "the approximate wiring length $L_{sig}$ almost matching the signal propagation path within the meander wiring."

In this way, as in FIG. 8B, in order for the approximate wiring length $L_{sig}$ to match up with the signal propagation path, the meander wiring (wiring width m, bending length b, wiring interval s) shall meet the following requirements.

3m<s<10m and 5m<b

In the event that the wiring bending length b is small in reference to the wiring width m, the measurement error for $L_{sig}$ and actual signal propagation path becomes great.

However, when b becomes smaller, because there is no purpose of performing the meander wiring (there is no need to calculate such meander wiring), in such a situation there is no need to consider it.

[In the Event that the Corner Unit of the Meander Wiring is R Wiring]

The subroutine depicted in the aforementioned FIG. 6 targets meander wiring with the corner unit bent at approximately 90-degrees. However, it is possible to use the original subroutine even in situations when the corner units are as follows.

Figure 9A:
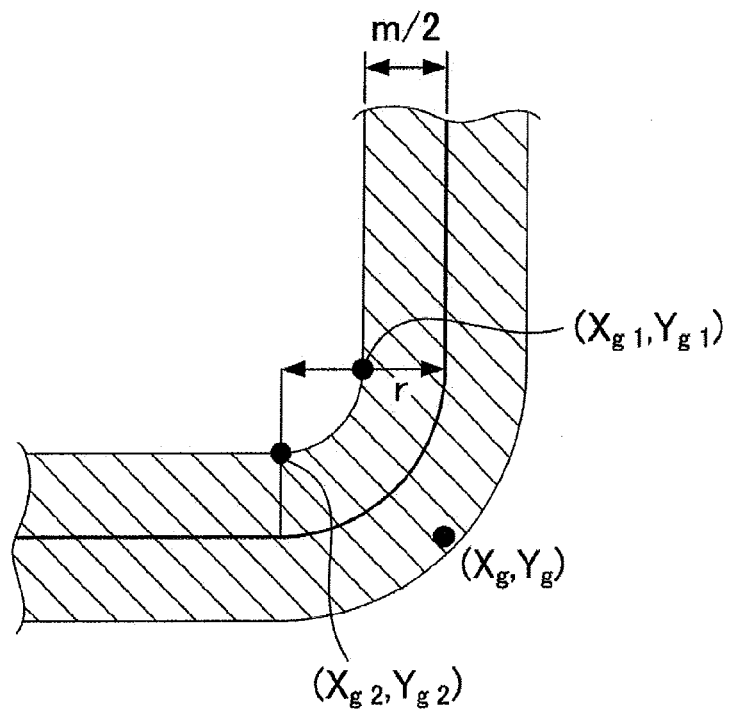
FIG. 9A is a drawing that shows the corner unit formed by the meander wiring's arc.
Figure 9B:
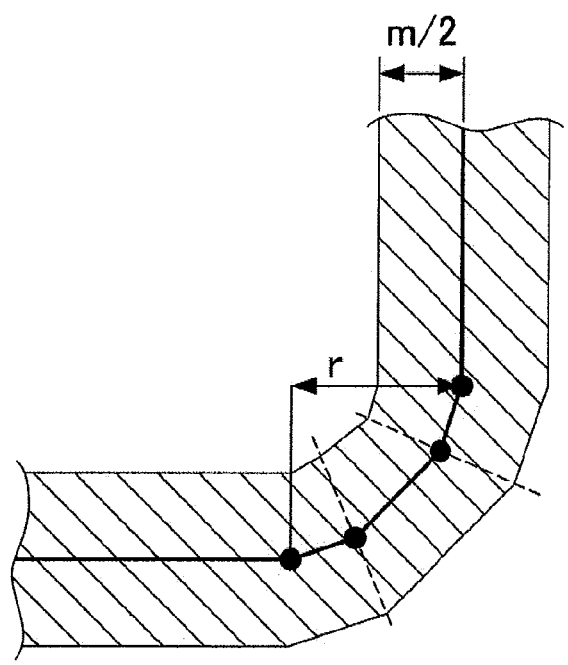
FIG. 9B is a drawing that shows the corner unit formed by at least three of the short line segments of meander wiring.

FIG. 9A is a figure that shows a corner unit that is formed with an arc of circumferential measure of 90-degrees, and FIG. 9B is a figure that shows a situation in which the corner unit is formed by more than three, short line segments. In these situations, the following processes are performed in Step S11 of FIG. 6.

As FIG. 9A shows, in the event that the center wire of the inner circuit side and outer circuit side of the corner unit related to the wiring's bending point $(X_g, Y_g)$ is formed by an arc of r, the CPU 15 provides an arc of radius $(r-m/2)$ (inner circuit arc) that is of the same center point as each arc's center point.

At this time, in order to make the circumferential angle 90-degrees, the same as the arc of radius r, the CPU 15 forms an inner circuit arc of radius $(r-m/2)$, and makes each arc's endpoint (starting point as well as ending point) $(X_{g1}, Y_{g1})$ and $(X_{g2}, Y_{g2})$.

As such, in the event of R wiring, the endpoints of bending point $(X_g, Y_g)$ become just the two points $(X_{g1}, Y_{g1})$ and $(X_{g2}, Y_{g2})$.

When the CPU 15 provides endpoints in this way, processes from Step S12 on of the aforementioned FIG. 6 are run. Therefore, in Step 12 of R wiring, the CPU 15 calculates each distance between each endpoint $(X_{gj}, Y_{gj})$ of bending point $(X_g, Y_g)$ and each endpoint $(X_{g+1\ j}, Y_{g+1\ j})$ of bending point $(X_{g+1}, Y_{g+1})$, and makes the shortest distance amongst them the distance between those bending points. Then, the distance between all adjacent bending points is sought out. However, with meander wiring, the arc is used with 90-degree $(=\pi/2)$ wiring.

The CPU 15 not only seeks the distances between all adjacent bending points as mentioned above, but also calculates $(r-m/2)*\pi/2$ for the length of each arc portion (each corner unit's inner circuit arc).

In Step S13, the CPU 15 seeks the shortest distance between all adjacent bending points and the sum of the length of all arc portions. Due to this, even if the corner unit of the wiring is an arc, the measurement of the wiring length becomes possible.

As shown in FIG. 9B, in the event that the corner unit is created from more than three, short, line segments, it can be considered that the length of corner unit's inner circuit is approximately equal (such errors are of a degree that can be ignored) to the length of the inner circuit arc of radius $(r-m/2)$.

Therefore, even in the situation of FIG. 9B, just as in the situation of FIG. 9A, it is possible to measure the wiring length.

[Second Subroutine]

Figure 10:
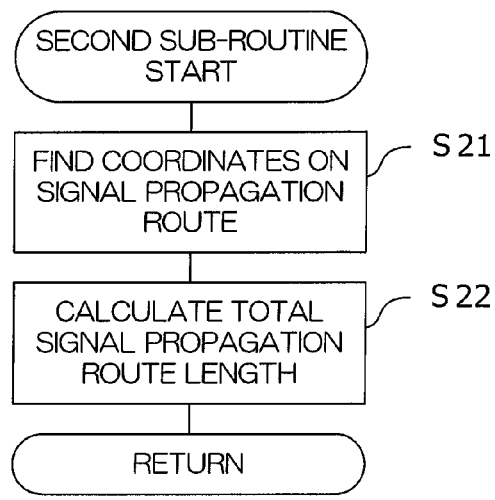
FIG. 10 is a flowchart that shows the second subroutine run in Step S4.

FIG. 10 is a flowchart that shows the second subroutine that is run on Step S4. Here, the meander wiring's corner unit is considered a straight-line wiring.

In Step S21, the CPU 15 finds the coordinates on the signal propagation route of the arbitrary bending point $(X_{g+1}, Y_{g+1})$.

Figure 11:
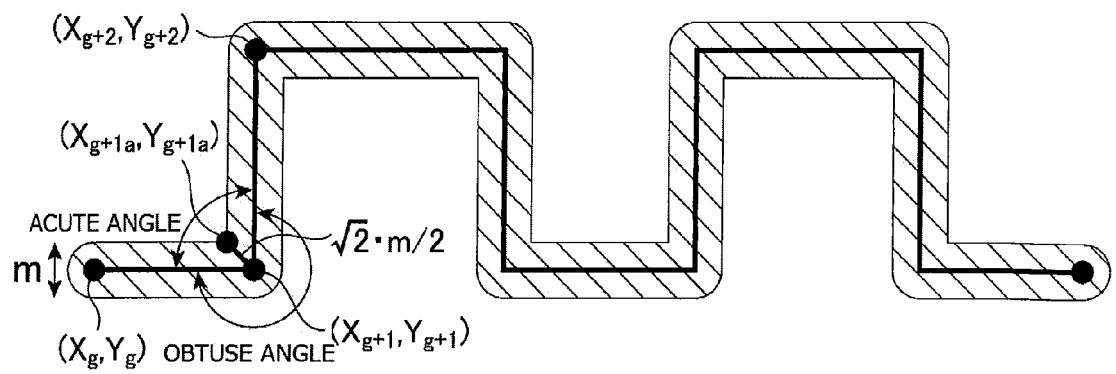
FIG. 11 is a drawing that shows the locational relationship of the bending point of the three points (acute angle side, blunt angle side)

Here, as FIG. 11 shows, first, due to the positional relationship of the three points, the bending points $(X_{g+1}, Y_{g+1})$ and the coordinates before and after, $(X_g, Y_g)$ and $(X_{g+2}, Y_{g+2})$, the acute angle side of the bending point $(X_{g+1}, Y_{g+1})$ and the acute angle side are sought out.

Because the beginning point $(X_0, Y_0)$ and end point $(X_n, Y_n)$ use the center points as they are, there is no need to find them.

Form a line segment of length $\sqrt{2} \cdot m/2$ along the direction in which the acute angle with $(X_{g+1}, Y_{g+1})$ as the starting point and $(X_{g+1}, Y_{g+1})$ as the vertex would be divided into two, and find the coordinates of the endpoints of this line segment as the coordinates through which the signals flows. Find the coordinates on the signal propagation route for all of the bending points in the same way.

In Step S22, the CPU 15 calculates the signal propagation route by finding the sum between the aforementioned coordinates from the beginning point and end point of the meander wiring.

As above, by using CAD's wiring data, the wiring length measurement apparatus 1, can accurately measure the meander wiring length by calculating the wiring length that is the actual signal coordinate distance by considering the wiring width of meander wiring.

Due to this, the wiring length measurement apparatus 1 can determine the accurate length of the meander wiring using a calculation of basic, simple comparison without considering the impact of the meander wiring's self stroke.

It should be noted that the current invention is not limited to the aforementioned implementation form and application is possible for design changes made within the range of the matter described within the patent claim range.

For example, with the aforementioned implementation form, the meander wiring is designed along the level direction (0-degrees) as well as the vertical direction (90-degrees), but is not limited to such designs.

Figure 12:
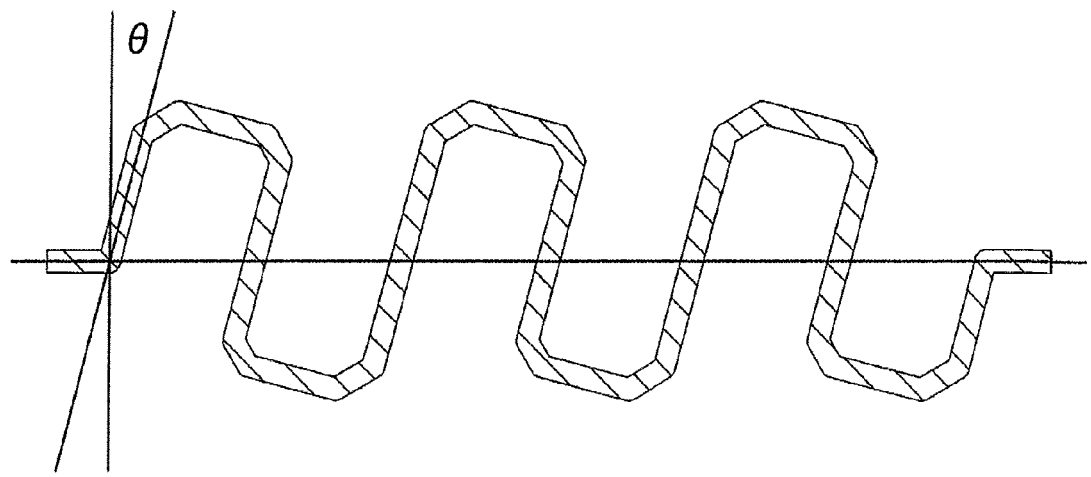
FIG. 12 is a drawing that shows the meander wiring's state of design parallel to the direction of angle 0-degrees in reference to the level and vertical direction of each seat's target axis direction.
Figure 13:
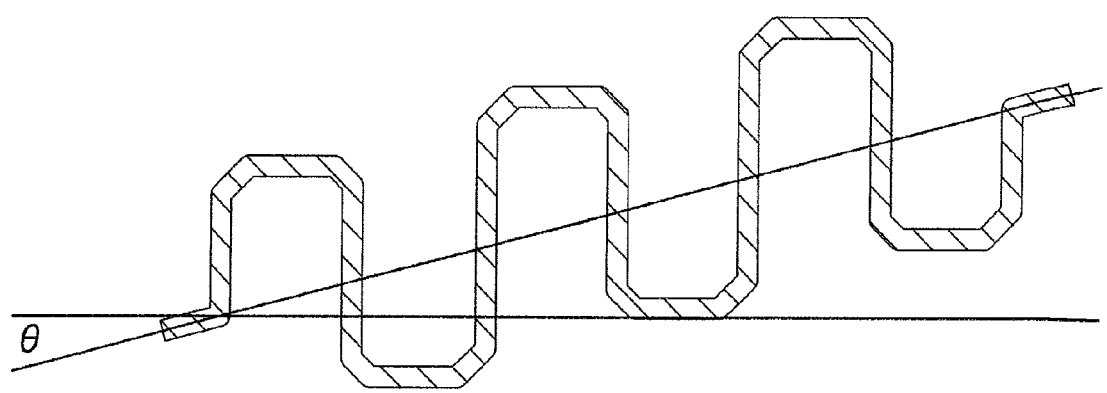
FIG. 13 is a drawing that shows the state of meander wiring rotated one sigma in each seat's target axis direction

As FIG. 12 shows, there are instances when the meander wiring is designed along the direction of angle θ in reference to each level and vertical coordinate axes direction. In this instance, as FIG. 13 shows, by rotating the meander wiring one θ in reference to each coordinate axes direction, it becomes corrected as if the meander wiring is designed along the level and vertical coordinate axes direction. As a result, as FIG. 12 shows, even in the event of the meander wiring being designed at an arbitrary angle θ in reference to each level and vertical coordinate axes direction, the wiring length measurement equipment of the present embodiment is able to measure the wiring length by using the aforementioned basic algorithm.

REFERENCE SIGNS LIST 1 wiring length measurement apparatus
11 input unit

12 RAM
13 ROM
14 HDD
15 CPU
16. display unit

The invention claimed is:

1. A wiring length measurement apparatus comprising:
a distance calculation unit configured to determine, by using a plurality of coordinates of bending points and a wiring width of CAD data of a high-density wiring including a meander wiring, for each of the bending points a respective distance-calculation endpoint that is located on an edge in a wiring width direction and is a flexion point on an inner circuit side of the respective bending point of the high-density wiring, the distance calculation unit being configured to calculate a distance between each two adjacent endpoints; and
a measurement unit configured to measure a wiring length of the high-density wiring by calculating a sum of the distances between each two adjacent endpoints calculated by the distance calculation unit.

2. The wiring length measurement apparatus according to claim 1,
wherein the distance calculation unit provides a plurality of endpoints in locations in consideration of a wiring width in relation to each bending point, and calculates a shortest distance between the endpoints of adjacent bending points.

3. The wiring length measurement apparatus according to claim 1, further comprising:
a judgment unit judging whether an error of the sum of the distances between the a plurality of bending points of the meander wiring and a signal propagation distance of the meander wiring is greater than a threshold or not by using a semiconductor accumulation circuit's signal frequency number, a wiring width, and a number of bending points,
wherein the distance calculation unit calculating a distance between the endpoints when the judgment unit judges the error as being equal to or greater than the threshold.

4. The wiring length measurement apparatus according to claim 3,
wherein the distance calculation unit calculating each distance between the a plurality of the bending points when the judgment unit judges the error as not being equal to or greater than the threshold.

5. The wiring length measurement apparatus according to claim 1,
wherein the judgment unit, in the event that the wiring has an arc portion, measuring the wiring length including an inner side arc length of the arc portion.

6. A computer readable storage device storing a program for operating a computer, the computer as modified by the program comprising:
a distance calculation unit configured to determine, by using a plurality of coordinates of bending points and a wiring width of CAD data of a high-density wiring including a meander wiring, for each of the bending points a respective distance-calculation endpoint that is located on an edge in a wiring width direction and is a flexion point on an inner circuit side of the respective bending point of the high-density wiring, the distance calculation unit being configured to calculate a distance between each two adjacent endpoints; and
a measurement unit configured to measure a wiring length of the high-density wiring by calculating a sum of the distances between each two adjacent endpoints calculated by the distance calculation unit.

7. A wiring length measurement apparatus comprising:
a measurement candidate point setting unit configured to set or define, for each respective bend or corner along a meander wiring of a high density wiring, a plurality of intersection points of boundary straight lines of the meander wiring in a neighborhood of each respective bend or corner as a plurality of measurement candidate points by using a wiring width and a plurality of corner coordinates of CAD data of a high-density wiring including the meander wiring;
a shortest-distance calculation unit configured to calculate, for every two adjacent bends or corners of the meander wiring, distances between each measurement candidate point corresponding to one of the adjacent bends or corners and each of the measurement candidate points corresponding to the other of the adjacent bends or corners, and further configured to select for each of the adjacent bends or corners a shortest distance from the respective calculated distances; and
a sum calculation unit calculating a sum of shortest distances between every two adjacent bends or corners for a wiring length of the high-density wiring.

8. The wiring length measurement apparatus according to claim 7,
wherein the measurement candidate point setting unit setting, with respect to a starting point and an ending point of the corner coordinates, a plurality of intersecting points of the boundary straight line passing through the neighborhood of the corner coordinate and the straight line that passes through the corner coordinate and runs orthogonal to the boundary straight line as a plurality of measurement candidate points.

9. The wiring length measurement apparatus according to claim 7, further comprising:
an arc length calculation unit calculating an arc length of an inner circuit side of a corner part in each corner part of the high-density wiring,
wherein the measurement candidate point setting unit setting, with respect to a corner coordinate of the corner part, each intersection point as a plurality of measurement candidate points of a plurality of border straight lines that pass through a neighborhood of the corner part and the corner part's arcs of the inner circuit side and outer circuit side,
the sum calculation unit that calculates the sum of the shortest distances between every adjacent corner coordinates and the arc length in each corner part calculated by the arc length measurement unit.

10. The wiring length measurement apparatus according to claim 7,
wherein the sum calculation unit calculating a sum of the distances between the corner coordinates as the high-density wiring's wiring length in the event that a multiplication value of a semiconductor accumulation circuit's signal frequency number, a wiring width, and a number of bending points is below a threshold.

11. The wiring length measurement apparatus according to claim 7,
wherein the meander wiring's wiring width is set by $3m<s<10m$ and $5m<b$ in an event that a meander wiring's wiring width is m, an interval with the adjacent wiring is s, and a length from the protruded unit's inner circuit side border to indented unit's inner circuit side border is b.

12. A computer readable storage device storing a program for operating a computer, the computer as modified by the comprising:
- a measurement candidate point setting unit configured to set or define, for each respective bend or corner along a meander wiring of a high density wiring, a plurality of intersection points of boundary straight lines of the meander wiring in a neighborhood of each respective bend or corner as a plurality of measurement candidate points by using a wiring width and a plurality of corner coordinates of CAD data of a high-density wiring including the meander wiring;
- a shortest-distance calculation unit configured to calculate, for every two adjacent bends or corners of the meander wiring, distances between each measurement candidate point corresponding to one of the adjacent bends or corners and each of the measurement candidate points corresponding to the other of the adjacent bends or corners, and further configured to select for each of the adjacent bends or corners a shortest distance from the respective calculated distances; and
- a sum calculation unit calculating a sum of shortest distances between every two adjacent bends or corners for a wiring length of the high-density wiring.

* * * * *